United States Patent
Sakuma

(10) Patent No.: US 6,169,400 B1
(45) Date of Patent: Jan. 2, 2001

(54) RADIO FREQUENCY COIL

(75) Inventor: Masaaki Sakuma, Tokyo (JP)

(73) Assignee: GE Yokogawa Medical Systems, Limited, Tokyo (JP)

( * ) Notice: Under 35 U.S.C. 154(b), the term of this patent shall be extended for 0 days.

(21) Appl. No.: 09/075,653

(22) Filed: May 11, 1998

(51) Int. Cl.$^7$ ........................................ G01V 3/00
(52) U.S. Cl. ............................. 324/318; 324/322
(58) Field of Search ................................. 324/318, 322, 324/300, 312, 314, 307, 309

(56) References Cited

U.S. PATENT DOCUMENTS

| | | | |
|---|---|---|---|
| 4,897,604 | * | 1/1990 | Carlson et al. ........................ 324/318 |
| 5,327,898 | * | 7/1994 | Yoshino et al. .................... 128/653.5 |
| 5,594,339 | * | 1/1997 | Henderson et al. .................. 324/318 |

FOREIGN PATENT DOCUMENTS

09010187 * 1/1997 (JP) .

* cited by examiner

Primary Examiner—Louis Arana
(74) Attorney, Agent, or Firm—Moonray Kojima

(57) ABSTRACT

In order to prevent the extremity ends of the flexible members from striking against the side surfaces of the inspected body mounting table when the flexible members are developed, there is provided a radio frequency coil having a pair of flexible base plates FXB in which the cylinder is formed under a state of free ends of these pair of flexible base plates and they are developed into a sheet under a state of not connecting the free ends from each other, wherein there are provided the shape defining members FRM installed at a side inside the cylinder from the fixed ends of the flexible base plates to their free ends, and the sheet ENV applied at the inner side of the cylinder from the fixed ends to the free ends of the flexible base plates.

12 Claims, 9 Drawing Sheets

RADIO FREQUENCY COIL

BACKGROUND OF THE INVENTION

This invention relates to a radio frequency coil, and more particularly an improvement of the radio frequency coil which is formed as a cylinder for storing an inspected object and in which this cylinder can be developed into a sheet.

In the case that an MRI processing, i.e. a Magnetic Resonance Imaging operation is carried out, a spin of a hydrogen atomic core or the like, for example, in an inspected object placed within a static magnetic field is excited to generate a magnetic resonance signal (MR signal), the MR signal is received by the radio frequency coil and then a spatial distribution image of the spin within the inspected object is generated in response to the received signal. The spatial distribution image of the spin expresses an internal image of the inspected object, thereby an imaging within the inspected object can be carried out.

As a method for applying a static magnetic field for the inspected object, there is provided a method for applying the static magnetic field in an orientation perpendicular to an axis of the body of the inspected object. As the vertical magnetic field system, there is provided a static magnetic field generating device in which two permanent magnets, for example, are oppositely faced to each other in an upward or downward orientation. This system is preferable in view of the fact that the static magnetic field generating device can be formed of an open-air type structure and a psychological burden of an inspected person can be reduced. In addition, this system is preferable in view of the fact that the static magnetic field space is set to be flat in a lateral direction and an inspected person having a little bit wider body width size can be received within the device without any trouble.

In order to receive a MR signal from a main body of the inspected body or the like, a radio frequency coil forming a cylindrical shape is used. The radio frequency coil is comprised of a base section installed at an imaging table and a pair of flexible sections fixed to both sides of the base section. The flexible section is comprised of a flexible base plate having a coil pattern and of an envelope enclosing the base plate.

The free ends of a pair of flexible sections are connected by a coupling section from each other to form a cylinder member. The connected state of the coupling section is released to cause a pair of flexible sections to be developed into a sheet-form at both sides of the base section. Riding-on or riding-off of the inspected body onto or from an imaging table is carried out under this developed state.

It is sometimes occurred that when the connected state of the coupling section is released to develop the radio frequency coil, extremity ends of the flexible section suspended at both sides of the imaging table may strike against side surfaces of the imaging table due to resiliency.

In the case that the connecting section is made of solid material such as a connector or the like, a substantial high striking sound is generated to prohibit a still state of the inspected person. In addition, this striking action may cause the side surfaces of the imaging table or the connector or the like to be damaged.

SUMMARY OF THE INVENTION

It is an object of the present invention to realize a radio frequency coil in which the extremity ends of the flexible section do not strike against the side surfaces of the inspected body mounting table when it is developed.

A first feature of the invention for solving the aforesaid problem is characterized in that the same is comprised of a base member; a pair of flexible base plates each of which has a coil circuit, one end of each of which is fixed to both sides of the base member, their intermediate section being curved to cause the other ends to be connected when a cylinder member is formed; connector members for connecting the other ends of the pair of flexible base plates to each other in such a way that they may be separated; shape defining members fixed at sides of the pair of flexible base plates which are inside the cylinder so as to define a curved shape of each of the pair of flexible base plates when the cylinder is formed; and a sheet member applied from one end to the other end of the pair of flexible base plates along the side of the shape defining members inside the cylinder.

In the first feature of the invention, the extremity ends of the flexible base plates are directed in an outward direction by a tension force applied to the sheet member when the flexible base plates are suspended down by the developed state of the radio frequency coil. Due to this fact, the extremity ends of the flexible base plates do not strike against the side surfaces of the inspected body mounting table. That is, it possible to realize the radio frequency coil in which the extremity ends of the flexible section do not strike against the side surfaces of the inspected body mounting table.

In the first feature of the invention, it is preferable to make the sheet member by fabric because the fabric is soft and durable against a tension force.

A second feature of the invention for overcoming the aforesaid problem is characterized in that the same is comprised of a base member; a pair of flexible base plates each of which has a coil circuit, one end of each of which is fixed to both sides of the base member, their intermediate section being curved to cause the other ends to be connected when a cylinder member is formed; connector members for connecting the other ends of the pair of flexible base plates to each other in such a way that they may be separated; shape defining members fixed at sides of the pair of flexible base plates which are inside the cylinder so as to define a curved shape of each of the pair of flexible base plates when the cylinder is formed; and a fixing member for use in fixing the latter of both a curved state at the base member side of the pair of flexible base plates defined by the shape defining members and a curved state at the connector member side of the pair of flexible base plates defined by the shape defining members.

In the second feature of the invention, since the curved state of the flexible base plate at the connector member side is fixed by the fixing member, the extremity end may be directed outward when the flexible base plate is suspended downward by the development of the radio frequency coil. Due to this fact, the extremity end of the flexible base plate does not strike against the side surface of the inspected body mounting table. That is, it is possible to realize the radio frequency coil in which the extremity end of the flexible section does not strike against the side surface of the inspected body mounting table during development operation.

A third feature of the invention for overcoming the aforesaid problem according to the first and second inventions is characterized in that the shape defining member has a plurality of parallel-connected grooves at an inner side of the cylinder extending axially in the cylinder.

In the third feature of the invention, the shape defining member prevents the flexible base plate from being curved at a place where the opening of the groove is closed so as to define its curved shape. Due to this fact, it is possible to define the curved shape of the flexible base plate by a simple mechanism.

In the third feature of the invention, it is preferable in view of dampening a rate of curvature in bending applied to the flexible base plate that the groove of the shape defining member is a U-shaped groove.

In addition, in the third feature of the invention, it is preferable in view of increasing a rigidity of a curved shape of the cylinder that the groove of the shape defining member is a V-shaped groove.

A fourth feature of the invention for overcoming the aforesaid problem is characterized in that the same is comprised of a base member; a pair of flexible base plates each of which has a coil circuit, one end of each of which is fixed to both sides of the base member, their intermediate section being curved to cause the other ends to be connected when a cylinder member is formed; connector members for connecting the other ends of the pair of flexible base plates to each other in such a way that they may be separated; and plate members arranged at sides of the pair of flexible base plates outside the cylinder and having a curve extending along the former of both a curved state at the base member side of the pair of flexible base plates and a curved state at the connector member side of the pair of flexible base plates.

In the fourth feature of the invention, the extremity end is moved away from the side surface of the inspected body mounting table by a method wherein the plate members resiliently support the flexible base plates when the radio frequency coil is developed. Due to this fact, the extremity end of the flexible base plate does not strike against the side surface of the inspected body mounting table. That is, it is possible to realize the radio frequency coil in which the extremity end of the flexible section does not strike against the side surface of the inspected body mounting table during development.

In the fourth feature of the invention, it is preferable in view of facilitating a handling of the radio frequency coil that the plate members are fixed to the base member.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
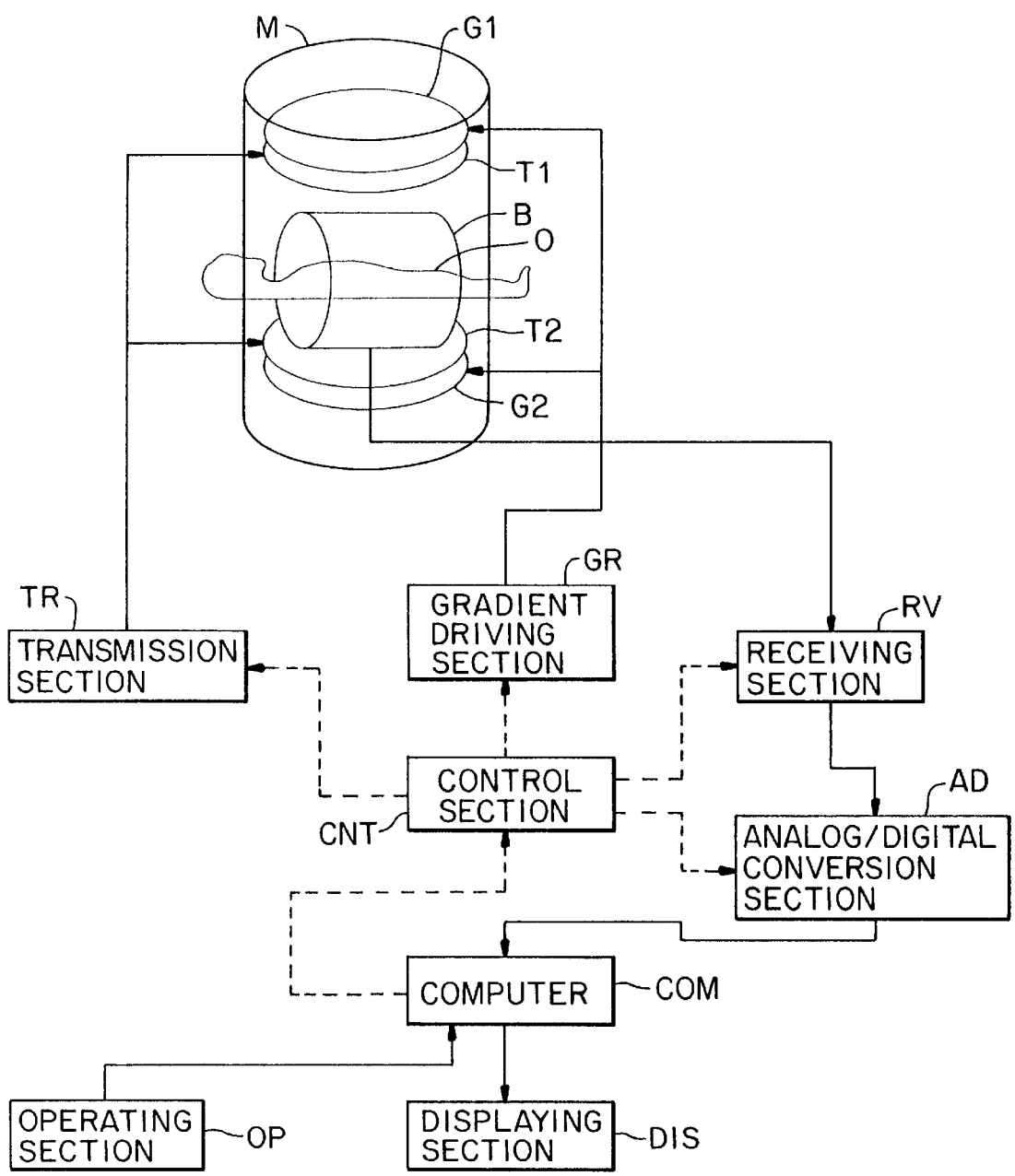
FIG. 1 is a block diagram for showing a magnetic resonance imaging device.

In FIG. 1 is shown a block diagram of an MRI device, i.e. a magnetic resonance imaging device. This device is operated to perform a magnetic resonance imaging by using a radio frequency coil of the present invention.

As shown in this figure, the present device is operated such that a static magnetic field generating section M may form a uniform static magnetic field in its inner space. The static magnetic field generating section M is comprised of a pair of magnetic generators formed by permanent magnets not shown, for example, these magnetic generators are spaced apart in a vertical direction and oppositely faced to each other so as to form a static magnetic field (a vertical magnetic field) in the opposing space. Each of gradient coil sections G1, G2 and transmission coil sections T1, T2 is arranged at the front surface of the magnetic generator and they are similarly spaced apart and opposed in a vertical direction from each other.

A body coil section B forming a cylinder assembly is installed within the static magnetic field space between the transmission coil sections Ti and T2. A central axis of the body coil section B is crossed at a right angle with a direction of the static magnetic field. The body coil section B is one example of a preferred embodiment of the radio frequency coil of the present invention. Details of the body coil section B will be described later. An inspected body O is inserted into the inner space of the body coil section B. A body axis of the inspected body O is crossed at a right angle with a direction of the static magnetic field.

A transmission section TR is connected to the transmission coils T1, T2. The transmission section TR applies a driving signal to the transmission coils T1, T2 so as to generate a radio frequency magnetic field, thereby a spin in the body of the inspected body O is excited. A gradient driving section GR is connected to the gradient coil sections G1, G2. The gradient driving section GR applies a driving signal to the gradient coil sections G1, G2 so as to generate a gradient magnetic field. To the body coil section B is connected a receiving section RV. To the receiving section RV is inputted a magnetic resonance receiving signal received by the body coil section B.

To the receiving section RV is connected an analog-to-digital conversion section AD. The analog-to-digital conversion section AD operates to convert an output signal of the receiving section RV into a digital signal. The analog-to-digital conversion section AD is connected to a computer COM. To the computer COM is inputted a digital signal from the analog-to-digital conversion section AD, wherein an image re-forming processing is carried out in response to this input digital signal and then an image of the inspected body O is generated.

To the computer COM are connected a displaying section DIS and an operating section OP. The displaying section DIS displays an image generated by the computer COM. The displaying section DIS also displays various kinds of information outputted from the computer COM. The operating section OP is operated by an operator so as to input various kinds of instructions or information to the computer COM.

To the computer COM is also connected a control section CNT. To the control section CNT are connected a transmission section TR, a gradient driving section GR, a receiving section RV, an analog-to-digital conversion section AD and an imaging table to be described later. To the control section CNT is given an instruction from the computer COM and then a control signal is given to each of the transmission section TR, the gradient driving section GR, the receiving section RV, the analog-to-digital conversion section AD and the imaging table so as to perform an imaging operation.

Figure 2:
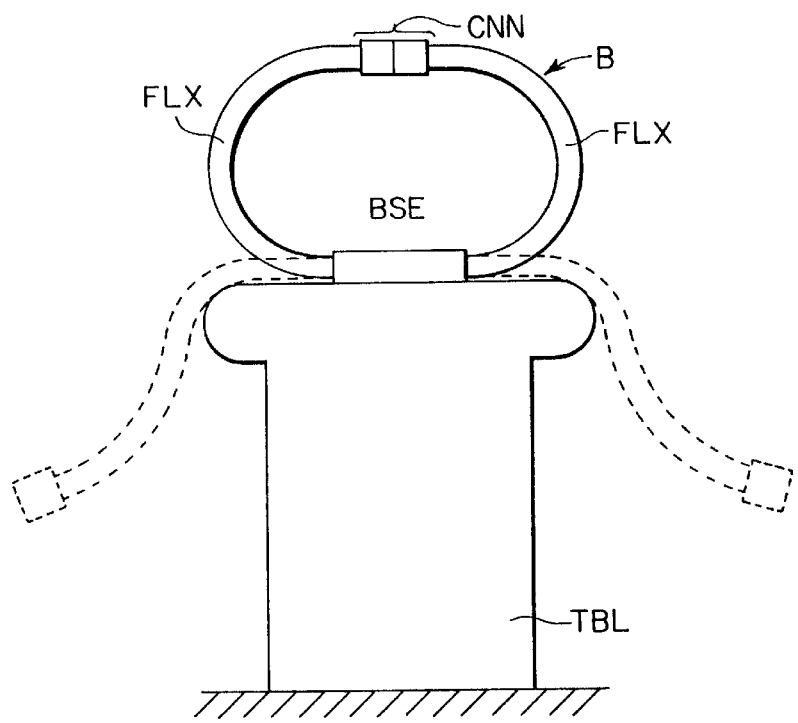
FIG. 2 is a schematic configuration view for showing one example of a preferred embodiment of the present invention.

Then, the body coil section B will be described. In FIG. 2 is illustrated a schematic configuration of the body coil section B. As shown in this figure, the body coil section B has a base section BSE and a pair of flexing sections FLX fixed to both sides of the base section. The base section BSE is one example of the preferred embodiment of the base member of the present invention.

One end of each of a pair of flexing sections FLX is fixed to both sides of the base section BSE while they are oppositely faced to each other. They may become fixing ends of the flexing sections FLX. The other ends of a pair of flexing sections FLX may become free ends. To these free ends is fixed each of a pair of units of the connectors CNN. The connectors CNN are one example of the preferred embodiment of the connector members in the present invention. The base section BSE is mounted at the imaging table TBL.

Free ends of a pair of flexing sections FLX are connected by the connector CNN from each other so as to form a cylinder together with the base section BSE. The cylinder is one example of the preferred embodiment of the cylinder in the present invention. The connected state of the connector CNN is released to cause the body coil section B to be developed into a sheet form, thereby a pair of flexing sections FLX are suspended down at both sides of the imaging table as indicated by a broken line.

Mounting of the imaging table TBL onto the inspected body is carried out at a waiting position of the imaging table TBL while the body coil section B is being developed as shown by a broken line in the figure. Upon mounting the inspected body, the inspected body is enclosed at its both sides by a pair of flexing sections FLX and then the connectors CNN are connected to each other as shown by a solid line to form a cylinder.

Under this condition, the imaging table TBL is moved to feed the inspected body into the static magnetic field space and then an imaging of the body is carried out. Upon completion of the imaging operation, the imaging table TBL is returned back to the waiting position, the coupled state of the connectors CNN is released to develop the body coil section B and then the inspected body is removed away from the imaging table TBL.

Figure 3:
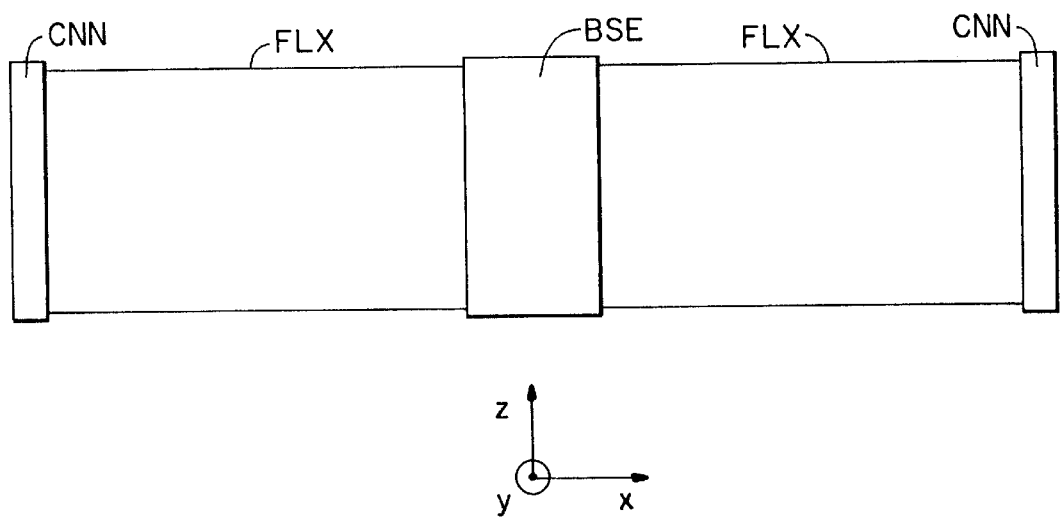
FIG. 3 is a schematic configuration view for showing one example of a preferred embodiment of the present invention.
Figure 4:
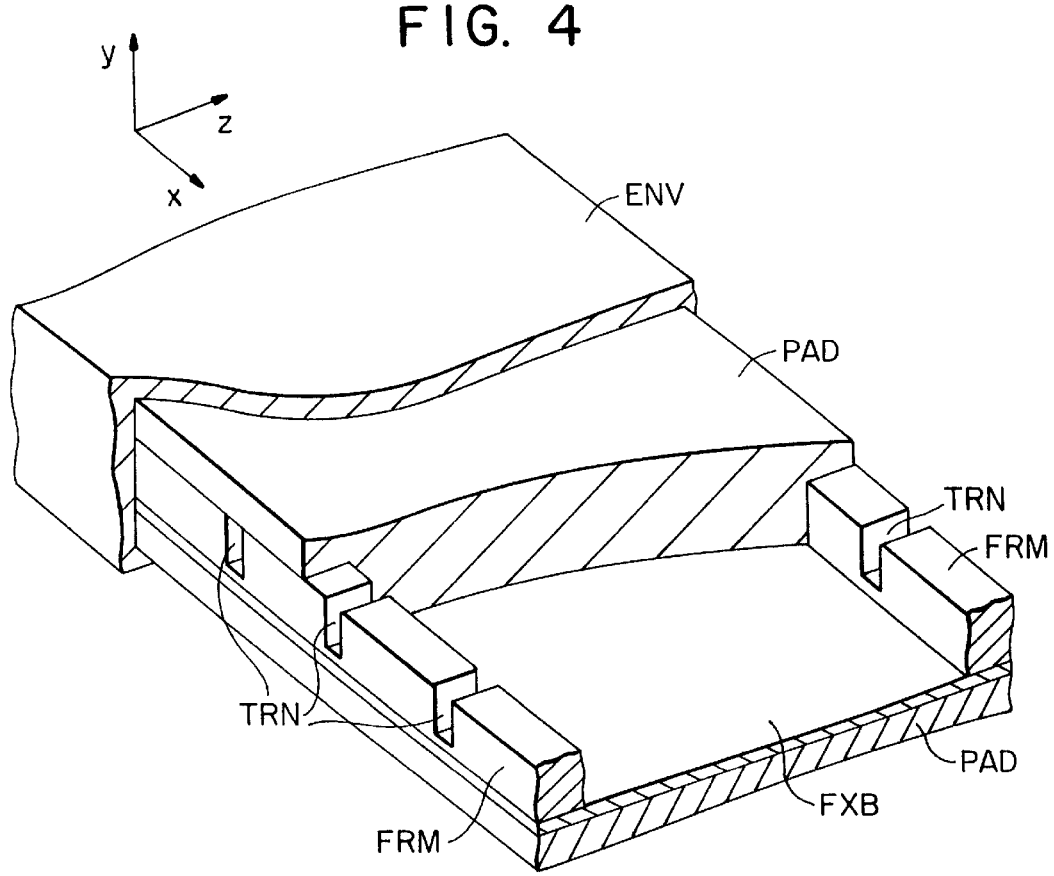
FIG. 4 is a broken sectional view for showing a partial configuration of one example of a preferred embodiment of the present invention.

In FIG. 3 is shown the body coil section B while being developed in its top plan view. In this figure, x, y and z denote three coordinate axes crossed to each other at a right angle. The direction x is a lateral direction of the body coil section B, the direction y is an upward or downward direction of the body coil section B and the direction z is an axial direction of the body coil section B. In FIG. 4 is shown the inner structure of the flexing section FLX under this state by a broken-away view. For a sake of convenience in description, a proportion in the upward or downward direction is exaggerated in FIG. 4.

Figure 5A:
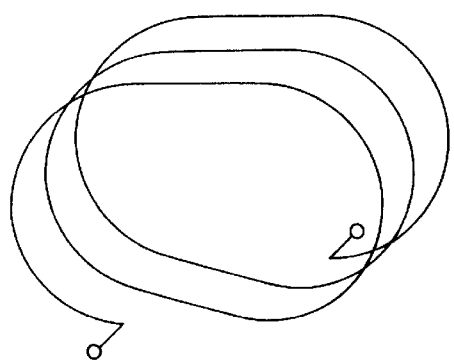
FIG. 5 is a circuit diagram of a coil in one example of a preferred embodiment of the present invention.
Figure 5B:
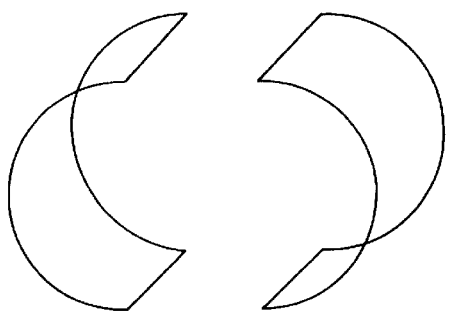

As shown in FIG. 4, the flexing section FLX is provided with a flexible base plate FXB. The flexible base plate FXB is one example of the preferred embodiment of the flexible base plate in the present invention. At the flexible base plate FXB, a pattern of an electric circuit not shown is formed by a printed circuit or the like, for example. When the cylinder is formed, the electric circuit may constitute either a solenoid coil shown in FIG. 5(*a*) or a saddle coil shown in FIG. 5(*b*). These coils are one example of the preferred embodiment of the coil in the present invention.

Both edges of the upper surface of the flexible base plate FXB are provided with a pair of shape defining members FRM over an entire length of the flexing base plate FXB. The shape defining member FRM is one example of the preferred embodiment of the shape defining member in the present invention. The upper surface of the flexible base plate FXB is a side where it becomes an inner surface when the cylinder is formed. The shape defining member FRM is made of plastics, for example.

The shape defining member FRM has a predetermined thickness in the direction y. The thickness is substantially set to such a degree as one in which a flexing is not produced. The shape defining member FRM has a plurality of U-shaped grooves TRN. The groove TRN is cut in the direction z and opened at its upper side.

The groove TRN has a length which is approximately equal to a thickness of the shape defining member FRM. With such an arrangement as above, a thickness at the bottom part of the groove TRN is quite thin. A thin thickness at the bottom part is thin in such a degree as one in which a sufficient flexibility may be generated. Or, the thickness at the bottom part may be set to 0.

Figure 6:
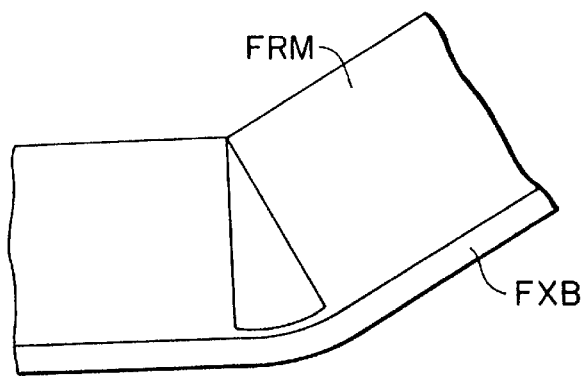
FIG. 6 is an illustrative view for explaining a function of a shape defining member in one example of a preferred embodiment of the present invention.

Due to the fact that such a shape defining member FRM as described above is arranged, when the flexible base plate FXB is bent in such a direction in which the cylinder is formed, the flexible base plate FXB is set such that only a part corresponding to a flexing part (the bottom part of the groove) of the shape defining member FRM is bent and an amount of bending is restricted to such a location in which the opening of the groove TRN is closed as shown schematically in FIG. 6. An allowable limit in the amount of bending is determined in response to a width of the groove and a range of bending in which the plate can be bent is increased as a width of the groove is wide.

Figure 7:
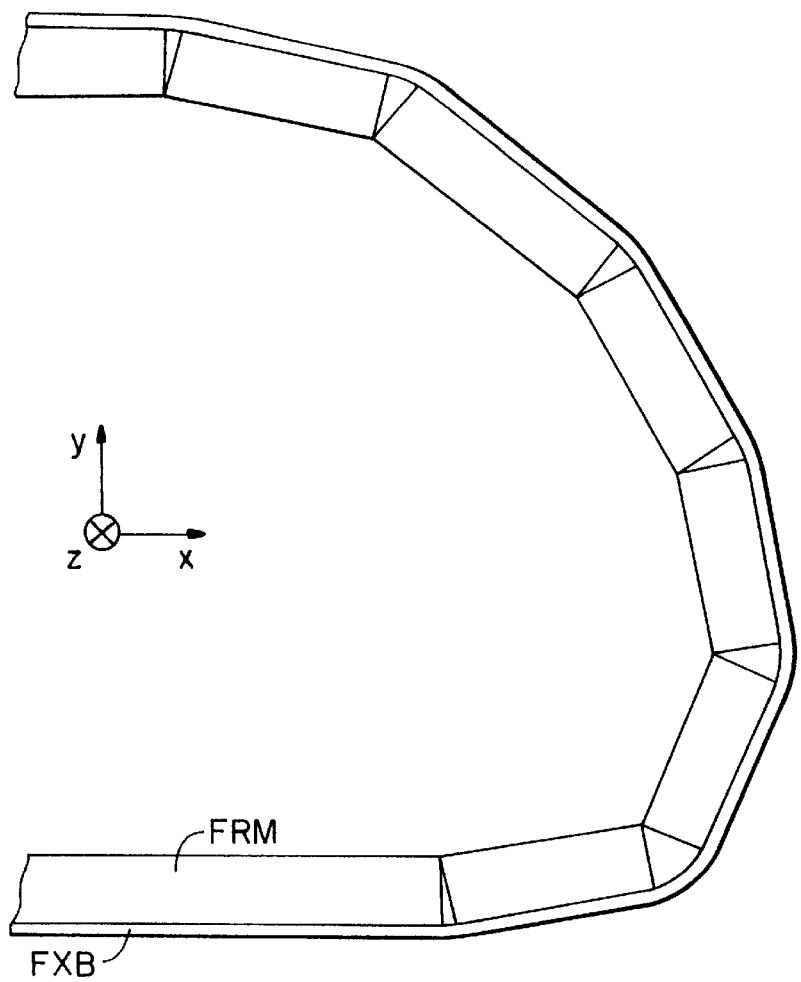
FIG. 7 is an illustrative view for explaining a function of a shape defining member in one example of a preferred embodiment of the present invention.

A width of the groove TRN and a groove space in the direction x are set in compliance with an amount of bending of each of the portions in the flexible base plate FXB when the cylinder is formed. With such an arrangement as above, when the cylinder is formed, for example, the bending of the flexible base plate FXB is formed as shown schematically in FIG. 7, for example. In FIG. 7, although only the right side portion is illustrated, the left side portion is symmetrical to the right side portion.

A bending shape of the cylinder, i.e. the body coil section B is uniformly determined in reference to such a bending action as above. A curving shape is set to become a definite shape to cause an electromagnetic condition of the body coil section B to be uniformly specified and then a stable imaging can be carried out.

Figure 8A:
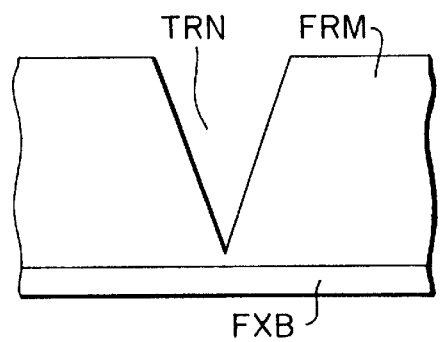
FIG. 8 is an illustrative view for explaining a function of a shape defining member in one example of a preferred embodiment of the present invention.
Figure 8B:
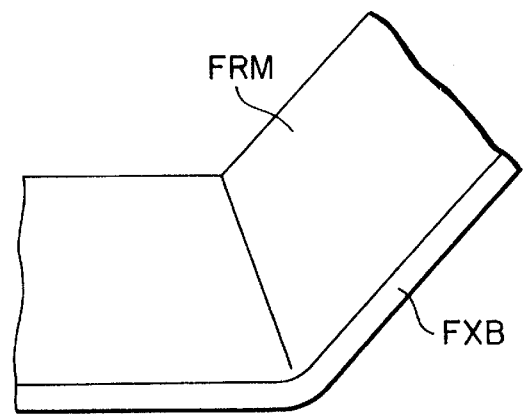

As shown in FIG. 8(a), the shape of the groove TRN of the shape defining member FRM may be of a V-shape. Also in this case, the amount of bending is limited to such a location as one in which the opening of the groove is closed. The V-shaped groove is preferable in view of the fact that a rigidity of holding the shape of it during its bending is more superior than that of the U-shaped groove because the entire wall surfaces of both sides of the groove are contacted when the opening is closed.

On the contrary, in the case of U-shaped groove, since the thickness of the shape defining member FRM provides a radius of curvature of the bending section, it is preferable in view of the fact that a severe bending of the flexible base plate FXB is dampened more than that of the V-shaped groove.

Referring again to FIG. 4, there is provided a dampening member PAD such as a sponge or the like, to cover the shape defining member FRM and the flexible base plate FXB. The lower surface of the flexible base plate FXB is also provided with a similar dampening member PAD.

The aforesaid structure is enclosed by the envelope ENV. The envelope ENV is set such that a fixing end of the flexing section FLX is fixed to the base section BSE and its free end section is fixed to the connector CNN. Fixing of these both ends is carried out by an appropriate means such as adhesion, holding, fixing with rivets and a sewing or the like. In view of attaining a simple fixing means, it is preferable to utilize a coupling means capable of performing a free adhesion or a free peeling-off under utilization of entangling of the fibrous spiked elements or the like. The envelope ENV is one example of the preferred embodiment of the sheet member in the present invention.

The envelope ENV is comprised of a sheet made of material which is endurable against tension force and shows a little elongation. As the sheet material, a woven fabric or the like is used. The woven fabric is preferable in view of the fact that it has a softness and a better touch feeling. Woven fabrics woven with threads of synthetic fibers having a high tensile strength or the like are preferably applied in view of the fact that they may be durable against a high tensional force. It may also be preferable that a plurality of laminated woven fabrics are used as required.

The body coil section B having such a configuration as above is mounted on the imaging table TBL under a condition in which the free ends are connected to each other by the connectors CNN. When the coupled state of the connectors CNN is released from this connected state so as to develop the body coil section B, the flexing sections FLX suspend down at both sides of the imaging table TBL by their own weight. This state is shown in FIG. 9.

During the process of suspending down, a bending force is applied to the flexing section FLX in an opposite direction of forming the cylinder. Since this force tries to further widen an opening of the groove TRN of the shape defining member FRM from its surface developed state, a tension is applied to the side of the envelope ENV inside the cylinder.

Figure 9:
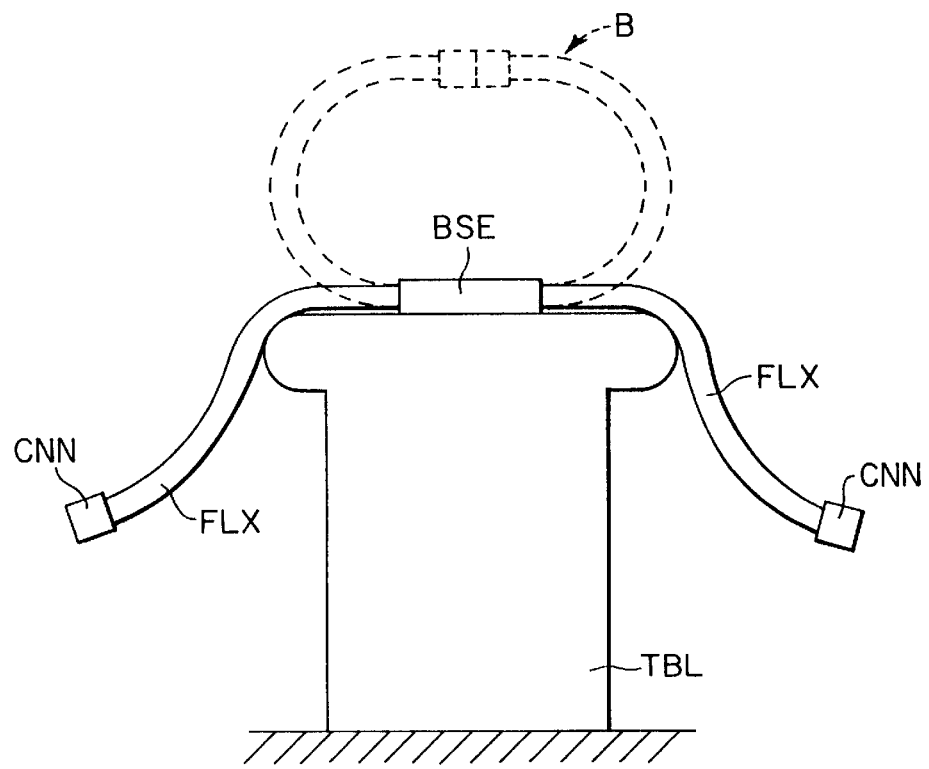
FIG. 9 is a view for showing a developed state of one example of a preferred embodiment of the present invention.

Since the envelope ENV is made of material showing a small elongation, its tension may act in such a direction as to oppose a bending of the flexing section FLX as described above, resulting in that each of the flexing sections FLX is suspended down while being in a zigzag form as shown in FIG. 9. That is, the flexing sections FLX are suspended down while the free ends of the flexing sections FLX are faced to move away from the side surface of the imaging table TBL.

Due to this fact, when the body coil section B is developed, the connectors CNN do not strike against the side surface of the imaging table TBL by their own resiliency. Accordingly, occurrence of striking sound or damage of the connectors CNN or the side surface of the imaging table TBL is prevented.

In addition, since the flexing sections FLX show a short suspending length by an amount of zigzag formation, if the flexing sections FLX suspend down without any zigzag formation, the connectors CNN do not strike against a floor even in the case that the connectors CNN are such long enough to strike against the floor.

Figure 10:
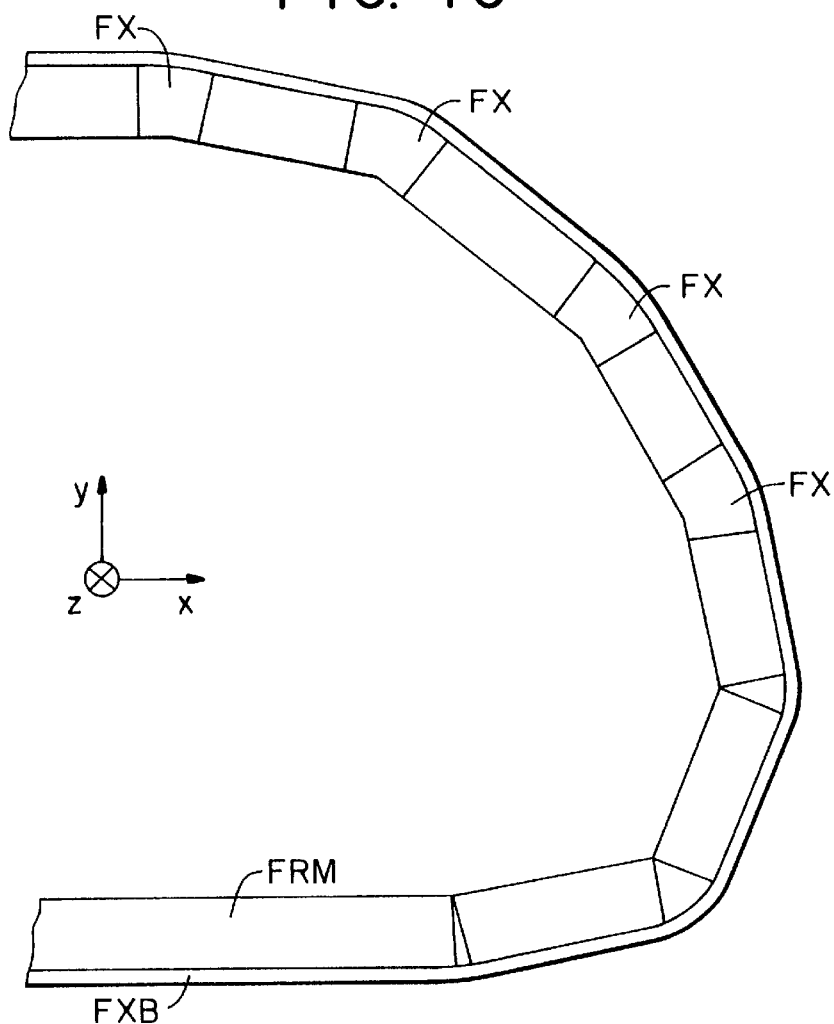
FIG. 10 is a view for explaining a function of a fixing member in one example of a preferred embodiment of the present invention.

In FIG. 10 is shown another example in configuration of the body coil section B. This is one example of the preferred embodiment of the present invention. Although only the right side portion is illustrated in this figure, its left side portion is symmetrical to the right side portion. As shown in this figure, the shape defining member FRM is provided with a fixing member FIX for use in fixing the shape defining member in its bent state at a portion corresponding to an upper half segment of the cylinder. In this specification, bending of the portion corresponding to the upper half segment of the cylinder is defined as a curvature of the flexing base plate at its connector member side. The fixing member FIX is one example of the preferred embodiment of the fixing member in the present invention.

Figure 11:
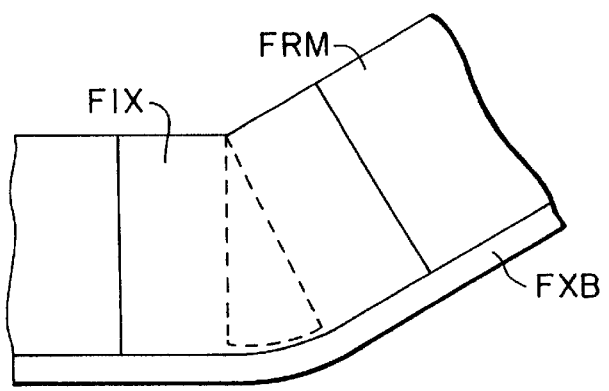
FIG. 11 is a view for explaining a function of a fixing member in one example of a preferred embodiment of the present invention.

As shown in an enlarged figure of FIG. 11, the fixing member FIX is fixed to the bent portion of the shape defining member FRM so as to fix it in a state in which the opening of the groove is being closed. Fixing of the fixing member FIX is carried out by proper means such as screws, rivets or adhesions or the like. With such an arrangement as above, the bending of the upper half segment of the cylinder is fixed under a predetermined state. That is, the bending of the portion of the curved shape of the cylinder which is a so-called shoulder is fixed.

Figure 12:
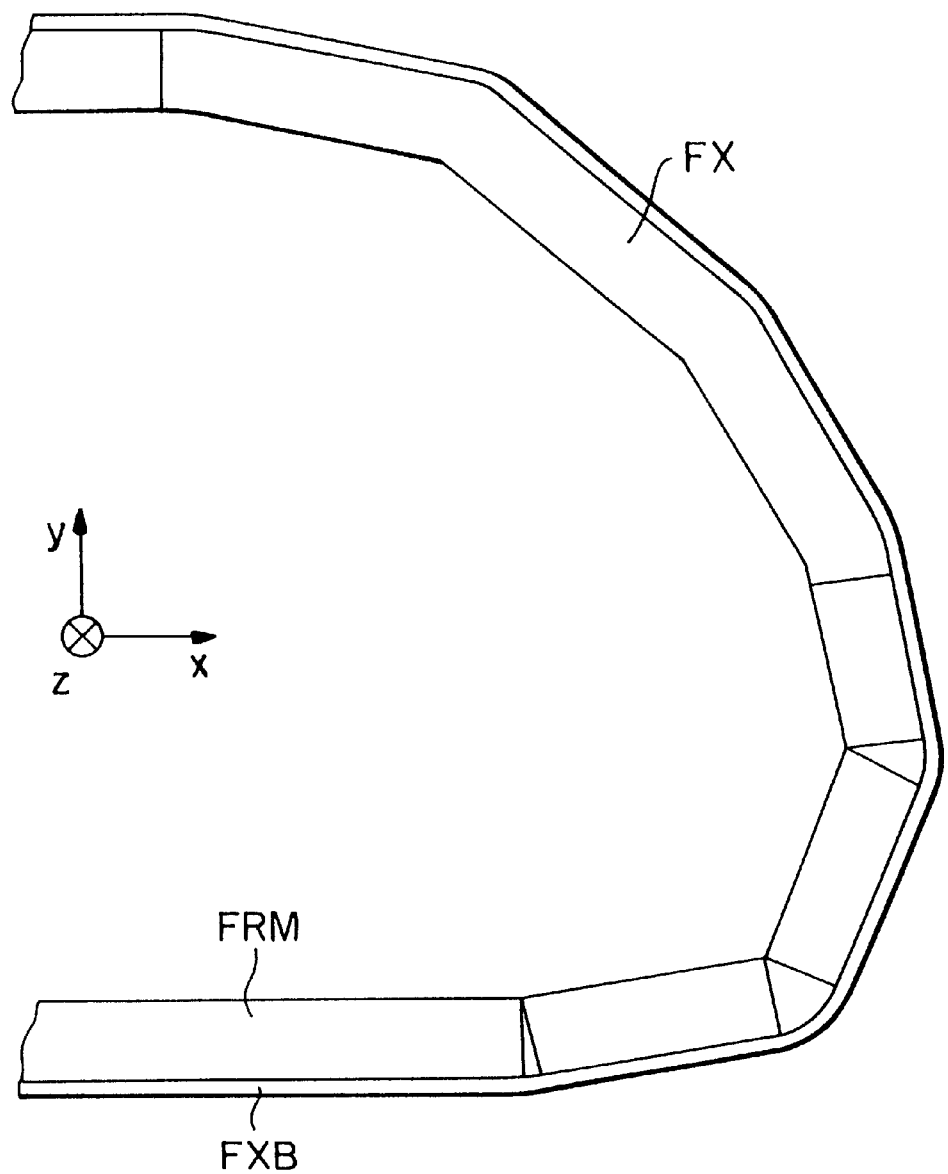
FIG. 12 is a view for explaining a function of a fixing member in one example of a preferred embodiment of the present invention.

In addition, as shown in FIG. 12, the fixing member FIX may be formed such that a plurality of bending segments are totally fixed. This is preferable in view of the fact that the number of components of the fixing member can be reduced. On the contrary, it is preferable to use the fixing member FIX for every bending portions as shown in FIG. 10 in view of the fact that the fixing location can be individually selected.

Figure 13:
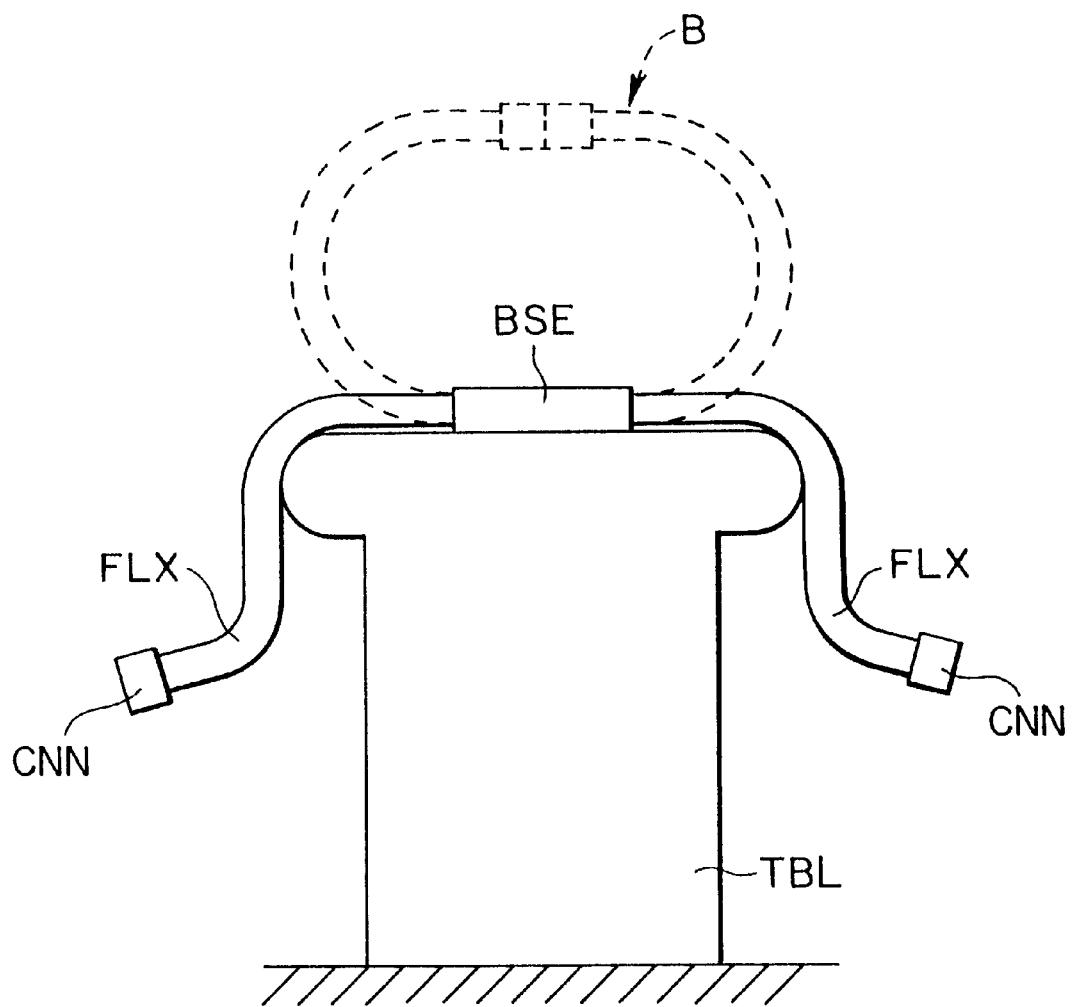
FIG. 13 is a view for showing a developed state of one example of a preferred embodiment of the present invention.

When such a body coil section B as one described above is developed after releasing the coupled state of the connectors CNN, the flexing sections FLX suspend down at both sides of the imaging table due to the free bending of the shape defining member FRM at the portion corresponding to the lower half segment of the cylinder. However, the bending of the extremity end of each of the flexing sections is fixed in a direction forming the cylinder, resulting in that as shown in FIG. 13, the free ends are faced to move away from the side surface of the imaging table, thereby the striking against the side surface of the imaging table TBL is prevented.

Figure 14A:
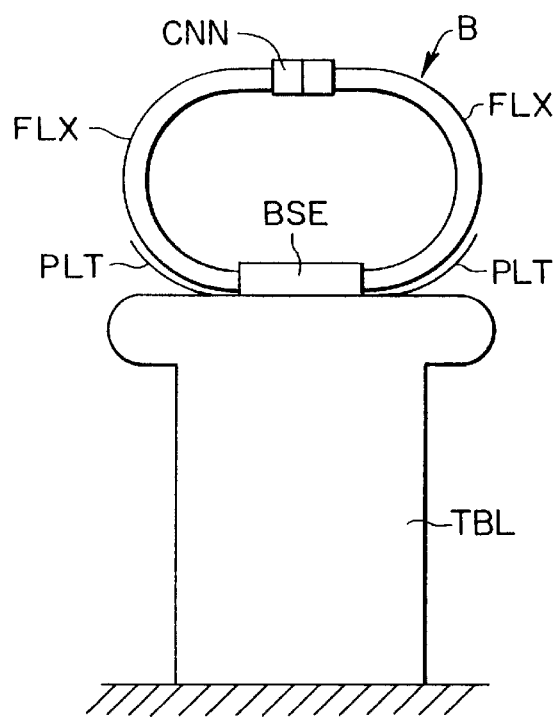
FIG. 14 is a schematic configuration view for showing one example of a preferred embodiment of the present invention.

In FIG. 14 is illustrated a still further configuration of the body coil section B. This is also an example of the preferred embodiment of the present invention. As shown in FIG. 14(a), the body coil section B is provided with resilient thin plate members PLT below the base section BSE. The thin plate members BLT are one example of the preferred embodiment of the plate member in the present invention.

The thin plate member PLT is constituted by a thin plate of plastic material, for example. As the plastic material, it is preferable to apply vinyl chloride because it has a suitable resiliency. The thin plate member PLT has a curvature extending along the lower half segment of the body coil section B forming the cylinder. With such an arrangement as above, when the body coil section B is used under the state of forming the cylinder, the thin plate members PLT are prevented from being hindered. In addition, in the present specification, a curvature of the portion corresponding to the lower half segment of the cylinder is defined as a curvature of the flexing base plate at the side of the base member.

The thin plate member PLT has an axial predetermined length of the body coil section B. Its length corresponds to a length of the body coil section B, for example. Or, it is also applicable that a plurality of short thin plate members are arranged side by side from each other.

Figure 14B:
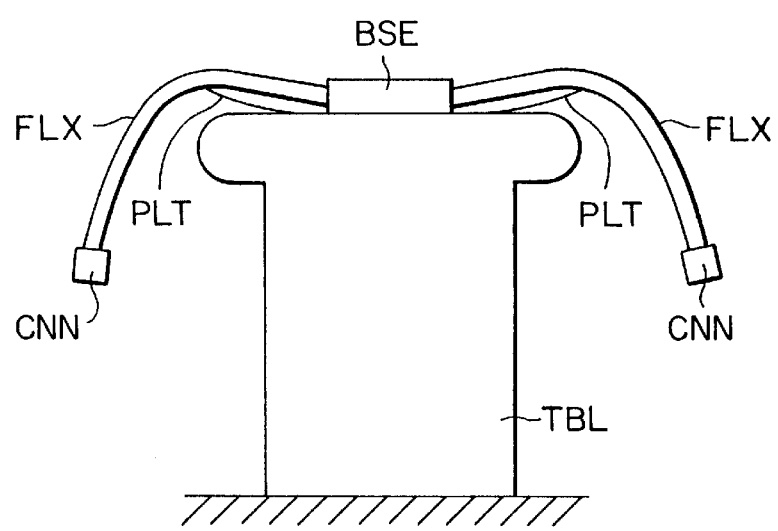

As shown in FIG. 14(b), when the coupling of the connectors CNN is released to develop the body coil section B, the thin plate members PLT are flexed by their own weight while supporting the flexing sections FLX. At this time, a resilient force of each of the thin plate members PLT is set such that they may be flexed in such a degree as one in which their upward bendings may not be lost.

With such an arrangement as above, the flexing sections FLX may draw an arcuate curve over the extremity ends of the upward bent thin plate members PLT and suspend downwardly. Accordingly, a distance between the free end of the flexing section FLX and the side surface of the imaging table TBL is made wide to prevent both of them from being struck against to each other.

In the case that an inspected body is loaded on or unloaded from the imaging table TBL, the flexing sections FLX are further flexed due to the weight of the inspected body and they are almost made to be flat, so that the flexing sections FLX do not hinder the loading or unloading of the inspected body.

Striking preventive means by such thin plate members PLT as described above may be either the striking preventive means utilizing a tension force of the aforesaid envelope ENV or the striking preventive means utilizing the fixing member FIX or both of them may be used together. With such an arrangement as above, it is possible to realize a further superior striking preventive means.

Many widely different embodiments of the invention may be constructed without departing from the spirit and the scope of the present invention.

It should be understood that the present invention is not limited to the specific embodiments described in the specification, except as defined in the appended claims.

What is claimed is:

1. An elongated RF coil for use in an imaging system comprising a base, said coil comprising:
   an elongated planar conductive strip having two longitudinal sides and two ends;
   a pair of shape defining members disposed respectively on said two longitudinal sides of said strip;
   said pair of shape defining members having defined therein a plurality of grooves with the openings of the grooves directed away from a surface of said strip;
   a covering surrounding said strip in a transverse dimension thereof, and disposed about said pair of shape defining members;
   wherein one of said two ends of said strip is connectable to a connector means, and the other end of said two ends of said strip is connected to said base; and
   wherein in a closed state when said one end of said strip is connected to said connector means, said pair of shape defining members are bent to close said grooves so that said coil is generally circular shaped, and in an open state when said one end of said strip is not connected to said connector means, said pair of shape defining members are generally unbent so that said grooves are fully open and said coil is generally rigid and not free to strike equipment in said system.

2. The coil of claim 1, wherein said grooves are "V" shaped.

3. The coil of claim 1, wherein said grooves are "U" shaped.

4. The coil of claim 1, further comprising damping means disposed within said covering and in contact with said strip and said shape defining members.

5. The coil of claim 4, wherein said damping means comprise natural or synthetic sponge.

6. The coil of claim 1, wherein said strip is of flexible material.

7. The coil of claim 1, wherein said shape defining members are of plastic.

8. The coil of claim 1, wherein said shape defining members have a thickness sufficient to prevent flexing in one dimension.

9. The coil of claim 1, wherein said covering comprises woven material and has properties of limited tension and elongation.

10. The coil of claim 1, wherein said plurality of grooves are arranged parallel to each otehr and disposed transverse to said longitudinal dimension.

11. A pair of elongated RF coils for use in an imaging system wherein the pair of coils are connected at one end thereof to a base in said system and at another end to each other with a connector therebetween, each of said coils comprising:
   an elongated planar conductive strip having two longitudinal sides and two ends;
   a pair of shape defining members disposed respectively on said two longitudinal sides of said strip;
   said pair of shape defining members hapving defined therein a plurality of grooves with opening of the grooves directed away from a surface of said strip;
   a convering surrounding said strip in a transverse dimension thereof and surrounding part of said pair of shape defining members;
   wherein one of said two ends of said strip is connected to a connector means, and the other end of said two ends of said strip is connected to said base; and
   wherein in a closed state when one end of said strip is connected to said connector means, said pair of shape defining members are bent to close said grooves so that said coil is generally circular shaped, and in an open state when said one end of said strip is not connected to said connector means, said pair of shape defining members are generally unbent so that said grooves are fully open and said coil is generally rigid and not free to strike equipment in said system.

12. An imaging system comprising a base, a pair of elongated RF coils having end end thereof connected to a base, and anot end thereof connected to a connector means, each of said coils comprising:
   an elongated planar conductive strip having two longitudinal sides and two ends;
   a pair of shape defining members disposed respectively on said two longitudinal sides of said strip;
   said pair of shape defining members having defined therein a plurality of grooves with the openings of the grooves directed away from a surface of said strip;
   a covering surrounding said strip in a transverse dimension thereof, and disposed about part of said shape defining members;

wherein one of said two ends of said strip is connected to said connector means, and the other end of said two ends of said strip is conencted to said base; and wherein in a closed state when said one end of said strip is connected to said connector means, said pair of shape defining members are bent to close said grooves so that said coil is generally circular shaped, and in an open state when said one end of said strip is not connected to said connector means, said pair of shape defining members are generally unbent so that said grooves are fully open and said coil is generally rigid and not free to strike equipment in said system; and wherein said system further comprises:

a pair of resilient plates connected between said base and said pair of coils, whereby said plates are of dimension sufficient to hold said coils away from said equipment when said coils are in the open state.

* * * * *